(12) United States Patent
Vincent et al.

(10) Patent No.: US 12,267,965 B2
(45) Date of Patent: Apr. 1, 2025

(54) ELECTRONIC CIRCUIT

(71) Applicants: SAFRAN VENTILATION SYSTEMS, Blagnac (FR); ELVIA PRINTED CIRCUIT BOARDS, Coutances (FR)

(72) Inventors: Jacques Vincent, Blagnac (FR); Marc Ragonneau, Blagnac (FR); Pascal Rollin, Moissy-Cramavel (FR); Bertrand Duffaud, Blagnac (FR); Olivier Belnoue, Ondreville sur Essonne (FR)

(73) Assignees: SAFRAN VENTILATION SYSTEMS, Blagnac (FR); ELVIA PRINTED CIRCUIT BOARDS, Coutances (FR)

( * ) Notice: Subject to any disclaimer, the term of this patent is extended or adjusted under 35 U.S.C. 154(b) by 257 days.

(21) Appl. No.: 17/916,372

(22) PCT Filed: Apr. 1, 2021

(86) PCT No.: PCT/FR2021/050582
§ 371 (c)(1),
(2) Date: Sep. 30, 2022

(87) PCT Pub. No.: WO2021/198625
PCT Pub. Date: Oct. 7, 2021

(65) Prior Publication Data
US 2023/0156929 A1  May 18, 2023

(30) Foreign Application Priority Data

Apr. 3, 2020 (FR) ....................... 2003364

(51) Int. Cl.
*H05K 1/02* (2006.01)
*H05K 3/46* (2006.01)

(52) U.S. Cl.
CPC ......... *H05K 3/4691* (2013.01); *H05K 1/0265* (2013.01); *H05K 2201/10272* (2013.01)

(58) Field of Classification Search
CPC ............... H05K 1/0265; H05K 3/4691; H05K 7/14329; H05K 7/1772; H05K 7/1475; H05K 7/1478; H05K 2201/10272
See application file for complete search history.

(56) References Cited

U.S. PATENT DOCUMENTS

| 5,641,944 A | 6/1997 | Wieloch et al. |
| 6,062,903 A | 5/2000 | Hawes et al. |

(Continued)

FOREIGN PATENT DOCUMENTS

| DE | 10 2014 016 846 A1 | 5/2016 |
| EP | 0 929 123 A1 | 7/1999 |
| JP | 06-326428 A | 11/1994 |

OTHER PUBLICATIONS

"LED AGON", http://www.haeusermann.co.at Mar. 19, 2012 (Mar. 19, 2012), URL:http://www.haeusermann.co.at/downloads/unterlagen_unternehmen/ledagon_flyer.pdf, XP055261600, 2 pages.

(Continued)

*Primary Examiner* — Hoa C Nguyen
(74) *Attorney, Agent, or Firm* — Sughrue Mion, PLLC

(57) ABSTRACT

The invention relates to an electronic circuit (1) comprising a plurality of printed circuits (2) connected by at least one bus bar (4), each printed circuit (2) comprising at least two superposed layers enclosing at least a portion of said at least one bus bar (4), so as to cover said at least one bus bar (4).

14 Claims, 3 Drawing Sheets

(56) References Cited

U.S. PATENT DOCUMENTS

| | | | |
|---|---|---|---|
| 11,385,458 B2* | 7/2022 | Rafalowski | H05K 1/028 |
| 2010/0025090 A1 | 2/2010 | Delay | |
| 2010/0294544 A1* | 11/2010 | Momota | H05K 3/4691 |
| | | | 29/829 |
| 2012/0090881 A1 | 4/2012 | Sugiura et al. | |
| 2014/0124248 A1 | 5/2014 | Peck et al. | |
| 2015/0327355 A1 | 11/2015 | Wolfel | |
| 2019/0150269 A1* | 5/2019 | Klenk | B62D 5/0403 |
| | | | 310/68 R |
| 2019/0150299 A1* | 5/2019 | Naohara | H05K 5/064 |
| | | | 361/749 |
| 2021/0217741 A1* | 7/2021 | Ishimatsu | H01L 23/5227 |

OTHER PUBLICATIONS

International Search Report for PCT/FR2021/050582, dated Jul. 21, 2020.

* cited by examiner

ELECTRONIC CIRCUIT

CROSS REFERENCE TO RELATED APPLICATIONS

This application is a National Stage of International Application No. PCT/FR2021/050582 filed Apr. 1, 2021, claiming priority based on French Patent Application No. 2003364 filed Apr. 3, 2020, the contents of each of which being herein incorporated by reference in their entireties.

FIELD OF THE INVENTION

The present invention relates to the general field of electronic circuits and more particularly to the field of electronic circuits for turbomachines.

PRIOR ART

In the construction sector of aircraft turbomachines, the equipments integrating power electronics needs to be increasingly more compact for better integration.

In particular, for electronic circuits positioned against a circular electric motor of the turbomachine, it would be necessary to be able to optimise the mechanical integration thereof. In addition, it would be necessary to bring power control functions closer to minimise switching losses and to reduce inductance, and hence the over-sizing of components.

Also, within a turbomachine the power electronics must be able to operate at high currents possibly exceeding 400 Arms to meet aircraft requirements.

However, the electronic circuits positioned against a circular electric motor must also manage low-power signals.

Yet, current solutions combining power and low-power signals generate perturbations that are difficult to correct if filtering between the power source and the power electronics is not properly obtained.

This requires the addition of a filter circuit having a size proportional to motor power and to the distance between the source of perturbations and the circuit to be protected, and therefore of substantial volume.

For high-power motors (higher than 50 kW), the size and weight of this filtering can be greater than that of the power electronics part: the part having the functions to be filtered.

The generated perturbations are the following:

Self-inductance on the DC bus between the power switches;

Deformation and delaying of power switch control signals.

To reduce the impact of these phenomena, it is respectively known to add high energy capacitors to the detriment of the compactness of the system and at additional cost and/or to add conditioning functions of the control signals towards the power electronics requiring space and expense.

Nonetheless, these provisions do not allow perturbations to be fully overcome. This therefore leads to limiting the performance levels to be reached.

Within this context, it is a goal of the invention to provide an electronic circuit able to be placed flat against a circular electric motor, taking up reduced volume and combining both low-power signals and power electronics.

DESCRIPTION OF THE INVENTION

In a first aspect, the invention proposes an electronic circuit, for example a rigid-flex electronic board, comprising a plurality of printed circuits connected by at least one busbar, each printed circuit comprising at least two superposed layers enclosing at least one portion of said at least one busbar to embed said at least one busbar.

The electronic circuit can have spaces between the printed circuits, wherein the spaces only comprise said at least one busbar.

Said at least one busbar in each space between the printed circuits is bendable so that two adjacent printed circuits lie in two secant planes.

Said at least one busbar can be bended between two printed circuits so that the assembly of the printed circuits defines facets of a substantially hemispherical casing.

At least one of the printed circuits may comprise at least two busbars.

Said at least two busbars can have different electrical and/or mechanical properties.

At least one of the printed circuits may have a connector allowing to connect at least two elements among the two layers and the at least one busbar.

At least one of the printed circuits can have on a first of the two layers thereof a high-power electronic network, and on a second of the two layers thereof a low-power electronic network.

According to another aspect, the invention concerns a method for fabricating an electronic circuit, comprising the following steps:

(a) positioning at least one busbar on at least two different printed circuit first layers that are adjacent and separated by a space, for connection thereof, leaving an inter-circuit space in which there is only said at least one busbar;

(b) stacking and layering at least one printed circuit second layer on said at least one busbar and a corresponding first layer, to embed said at least one busbar between the two layers;

(c) bending said at least one busbar in each inter-circuit space.

Step (c) can comprise the following steps:

(c1) bending said at least one busbar in each inter-circuit space with a bending tool;

(c2) depositing an electrical insulator on said at least one busbar bended in each inter-circuit zone.

In another aspect, the invention concerns a turbomachine comprising a circular electric motor having an outer casing and an electronic circuit according to the invention, secured against said casing.

In another aspect, the invention concerns an aircraft comprising at least one turbomachine according to the invention.

DESCRIPTION OF THE FIGURES

Other features, objectives and advantages of the invention will become apparent from the following description that is solely illustrative and nonlimiting, and is to be read in connection with the appended drawings in which.

In all the Figures, similar parts carry same references.

DETAILED DESCRIPTION OF THE INVENTION

General Architecture

Figure 1:
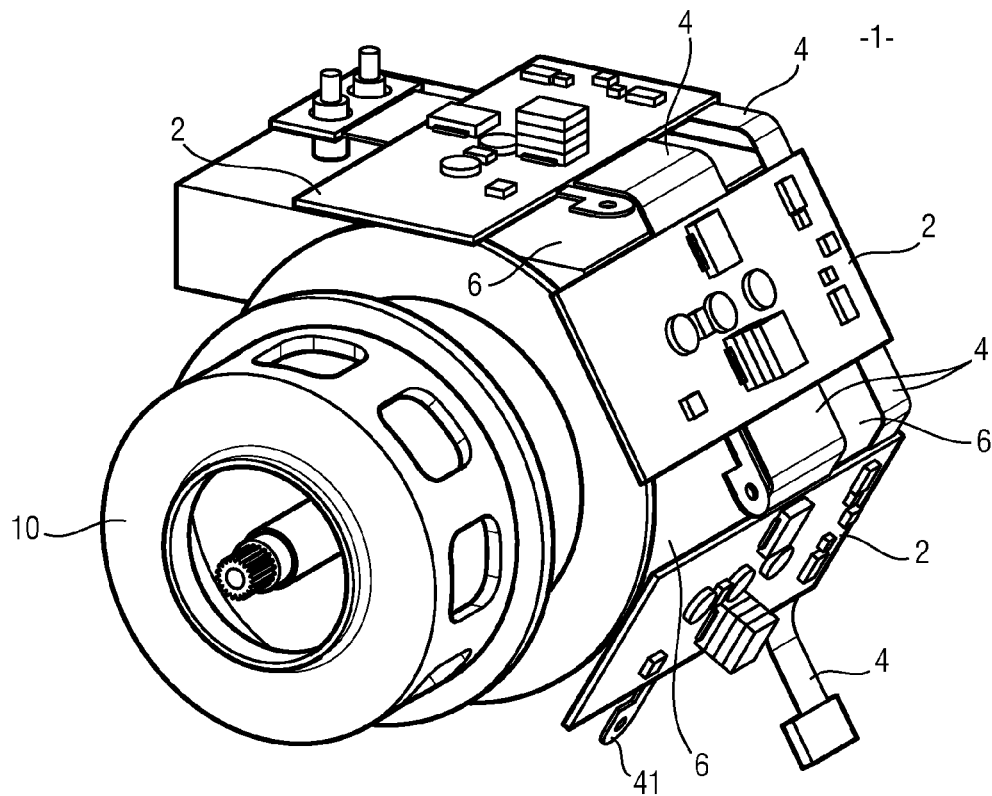
FIG. 1 is a perspective illustration of an electronic circuit according to the invention positioned around a circular electric motor.
Figure 2:
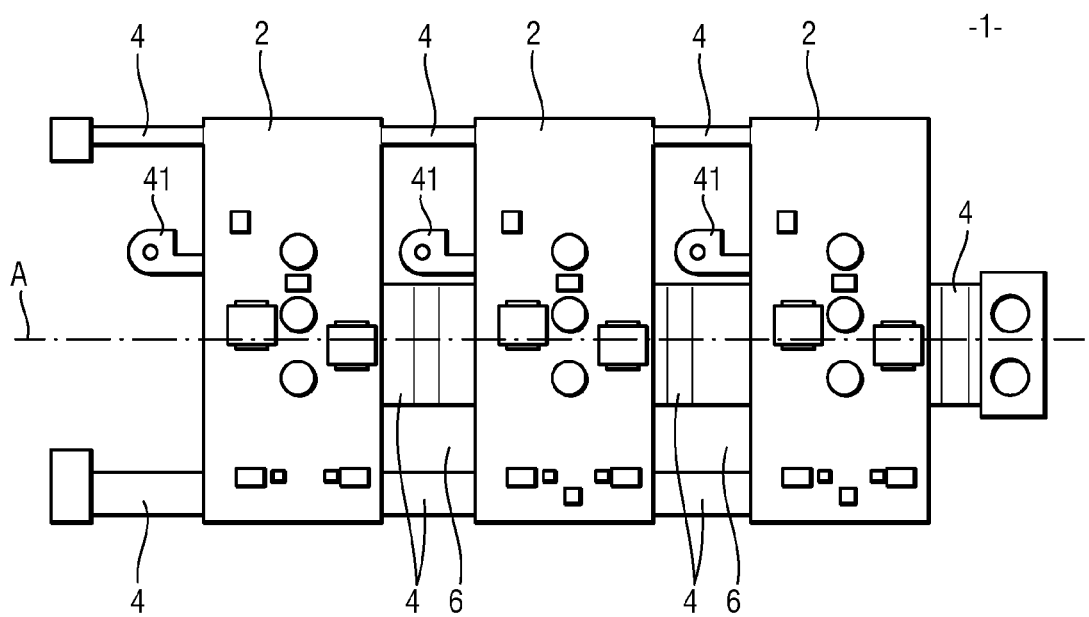
FIG. 2 illustrates an electronic circuit according to the invention before bending.
Figure 3:
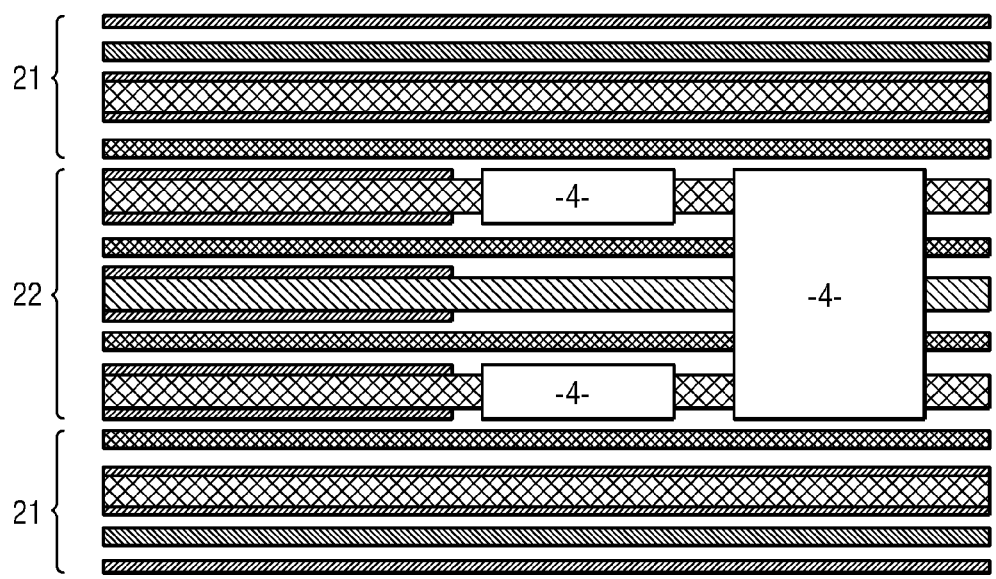
FIG. 3 is a partial cross-sectional illustration of a printed circuit according to the invention.
Figure 4:
FIG. 4 is an illustration of a busbar.
Figure 5:
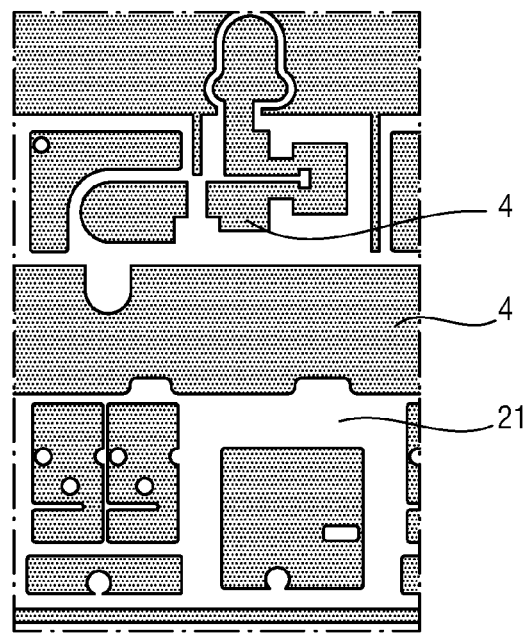
FIG. 5 illustrates the positioning of a busbar on a first layer of a printed circuit.
Figure 6:
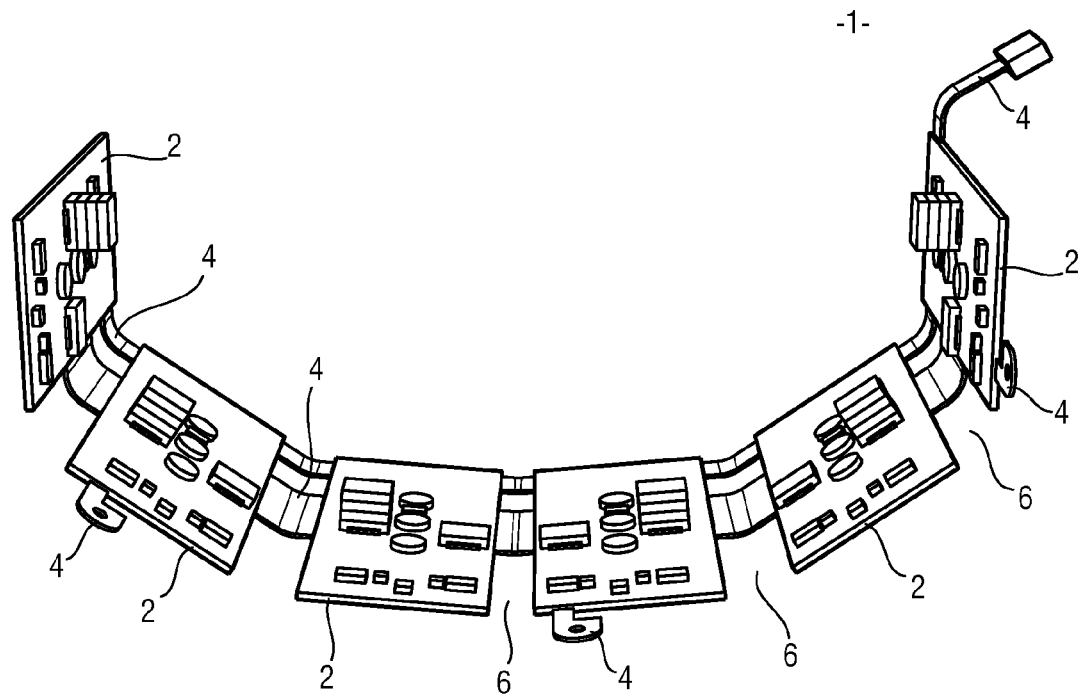
FIG. 6 illustrates the bending of the busbars between two printed circuits.

In a first aspect, the invention proposes an electronic circuit 1 comprising a plurality of printed circuits 2 connected by at least one busbar, each printed circuit comprising at least two superposed layers enclosing at least one portion of said at least one busbar 4, to embed said at least one busbar 4. This electronic circuit 1 is a rigid-flex electronic board for example. By rigid-flex electronic board, it is meant an electronic board having at least one first part that is more rigid than at least one second part. The first part is called the rigid part and the second part is called the flexible part.

The printed circuits form the first parts and are therefore the rigid parts of the electronic circuit. The busbars form the second parts and are therefore the flexible parts of the electronic circuit.

Busbars

The busbars 4 are elements well known in the field of electric power distribution. Typically, a busbar 4 can be a metal strip (or bar) allowing the distribution of strong currents. Most often, busbars 4 are in solid metal such as copper. However, it is possible to use a metal alloy or composite material sandwiching different metals.

The dimensions of each busbar 4 are defined as a function of the electric current that must circulate therein.

The busbars 4 of the invention can be coated with an insulating resin.

In addition, each busbar 4 can have branches and boreholes. The boreholes 41 can receive a connector to allow electrical connection between the busbar 4 and another element.

The busbars are electronically separate and can be superposed one over the other. Therefore, each busbar has a distinct position in the stack of layers of the printed circuit.

Structure of a Printed Circuit

As previously indicated, each printed circuit comprises a plurality of layers.

Typically, the printed circuits 2 comprise at least three layers: two outer layers 21 and at least one spacer layer 22.

The layers can be formed of an electrically insulating resin.

In particularly advantageous manner, the outer layers 21 can be in a rigid material and the or each spacer layer 22 (inner layer) can be in a softer material. Similarly, the layers can have different coefficients of expansion.

Each outer layer can have conductive tracks and receive electronic components. In known manner, the components can be inserted in boreholes. These boreholes are preferably bored in conductive tracks to connect the components electrically in a chosen architecture. In addition, the electronic components can be soldered or brazed onto the outer layers.

One or more busbars 4 can be embedded in the spacer layer(s) 22. Therefore, the printed circuits 2 can comprise at least two superposed layers on either side of each busbar so as to embed the busbars 4.

As illustrated in the Figures, the busbars 4 can be placed side by side or stacked. The spacer layer(s) 22 allows the busbars 4 to be insulated from each other and also to insulate them from the components of the outer layers 21.

Therefore, from one outer layer 21 to another of a printed circuit 2, the circuit can comprise a first electronic network structured upon a first outer layer 21, then one of more busbars 4 embedded in the spacer layer 22, and a second electronic network structured upon the second outer layer 21.

Evidently, this architecture is only an example. It is possible to have only one electronic network on only one outer layer 21, the other outer layer 21 being left blank.

Additionally, the printed circuit 2 may comprise connectors (also called vias) allowing electrical connection between several layers.

For example, a connector may allow an electronic network of an outer layer 21 to be electrically connected with a busbar 4, or two outer layers 21 to be electrically connected with a busbar, or two superposed busbars 4 to be connected together, etc.

In particularly advantageous manner, the multilayer structure of the printed circuits 2, incorporating a spacer layer 22 in which busbars 4 are embedded, allows to obtain—for example—a high-power circuit on one outer surface and a low-power circuit on another outer surface. This also allows to obtain a high electric power circulating in the busbars 4 and a low power circulating in the electronic networks of the outer surfaces. To summarise, the structure according to the invention makes it possible to have high and low electrical power in one same printed circuit 2.

Linking of Two Printed Circuits

As previously indicated, the electronic circuit 1 may comprise a plurality of printed circuits 2. The printed circuits 2 are physically linked and electrically connected by the busbars 4.

More specifically, preferably, the printed circuits 2 are spaced apart and separated by an inter-circuit space only comprising the busbars 4. In other words, the printed circuits 2 do not touch each other so that between each printed circuit 2 there is arranged a void space (i.e. a space not containing a printed circuit 2).

In one preferred embodiment, the printed circuits 2 are aligned in an axial direction A, so that the electronic circuit 1 has the appearance of a strip oriented along axis A.

Bending and Positioning Around a Motor

In particularly advantageous manner, the busbars 4 are bendable, and more particularly each portion of busbar 4 contained in an inter-circuit space 6 is bendable.

Therefore, in particularly advantageous manner, in the inter-circuit spaces, the busbars are flexed so that two adjacent printed circuits 2 lie in two secant planes.

Preferably, the electronic circuit 1 is adapted to be positioned around a circular electric motor. Therefore, in this context, the busbars 4 in the inter-circuit spaces 6 are flexed so that the assembly of printed circuits 2 defines facets of a substantially hemispherical casing.

Bending, in the form of a substantially hemispherical casing, most advantageously allows the electronic circuit 1 to be laid flat against a circular electric motor such as illustrated in FIG. 1.

Fabrication Method

In a second aspect, the invention concerns a method for fabricating the electronic circuit 1.

The fabrication method particularly comprises the following steps:
- (a) Positioning at least one busbar 4 on at least two different first layers of printed circuits 2, wherein the two different first layers are adjacent and separated by a space, for connection thereof, leaving an inter-circuit space 6 in which there is only said at least one busbar 4;
- (b) Stacking and layering at least one second layer of printed circuit 2 on said at least one busbar 4 and on a corresponding first layer, to embed said at least one busbar 4 between the two layers;
- (c) Bending said at least one busbar 4 in each inter-circuit space 6.

In addition, step (c) may comprise the following steps:
- (c1) Bending said at least one busbar 4 in each inter-circuit space 6 with a bending tool;
- (c2) Depositing an electrical insulator on said at least one busbar 4 bended in each inter-circuit zone.

Typically, step (c1) can be performed using a force assembly machine for electronic components called a press-fit machine. This type of machine has the advantage of developing sufficient force to bend busbars 4 while having accuracy adapted for the handling of electronic components.

Evidently, any type of machine can be used to bend the busbars 4, provided that bending can be achieved without damaging the printed circuits 2.

In one preferred embodiment, bending is performed after implanting the assembly of electronic components on the printed circuits 2.

At the time of bending, it can happen that an insulating coating present on the busbars 4 is locally abraded by the bending machine.

Therefore, at step (c2), provision can be made to re-deposit insulating coating on the bended busbars to guarantee good electrical insulation of the electronic circuit 1.

Turbomachine

In another aspect, the invention concerns a turbomachine comprising at least one electronic circuit 1 according to the invention.

Preferably, the electronic circuit 1 is bended to form a facetted hemispherical casing and is laid flat against a stator of a circular electric motor.

Aircraft

In a last aspect, the invention concerns an aircraft comprising at least one turbomachine according to the invention.

The invention claimed is:

1. An electronic circuit of rigid-flex electronic board, the electronic circuit comprising a plurality of printed circuits connected by at least one busbar, each printed circuit comprising at least two superimposed outer layers enclosing at least one spacer layer and at least one portion of said at least one busbar to embed said at least one busbar in the at least one spacer layer,
   at least one of the printed circuits, having on a first of the two superimposed outer layers thereof a high-power electronic network, and on a second of the two superimposed outer layers thereof a low-power electronic network.

2. The electronic circuit according to claim 1, wherein the electronic circuit has spaces between the printed circuits, wherein the spaces only comprise said at least one busbar.

3. The electronic circuit according to claim 2, wherein said at least one busbar in each space between the printed circuits is bendable so that the two printed circuits being adjacent lie in two secant planes.

4. The electronic circuit according to claim 3, wherein said at least one busbar is bended between the two printed circuits so that an assembly of the printed circuits defines facets of a substantially hemispherical casing.

5. The electronic circuit according to claim 1, wherein at least one of the printed circuits comprises at least two busbars, said at least two busbars being electrically separated.

6. The electronic circuit according to claim 5, wherein said at least two busbars have different electrical and/or mechanical properties.

7. The electronic circuit according to claim 5, wherein the at least two busbars are superposed.

8. The electronic circuit according to claim 1, wherein at least one of the printed circuits has a connector allowing to connect at least two elements among the two layers and the at least one busbar.

9. The electronic circuit according to claim 1, wherein the printed circuits form first parts of the electronic circuit and the at least one busbar form second parts of the electronic circuit, the first parts being more rigid than the second parts.

10. The electronic circuit according to claim 1, wherein one of the printed circuits has a first component and another of the printed circuits has a second component, the first component being connected to the second component by the at least one busbar.

11. A turbomachine comprising a circular electric motor having an outer casing, and the electronic circuit according to claim 1 secured against said casing.

12. An aircraft comprising at least one of the turbomachine according to claim 11.

13. A method for fabricating an electronic circuit according to claim 1, the method comprising:
   positioning at least one busbar on at least two different printed circuit first outer layers that are adjacent and separated by a space, for connection thereof, leaving an inter-circuit space in which there is only said at least one busbar;
   stacking and layering at least one printed circuit second outer layer on said at least one busbar and a corresponding one of the at least two different printed circuit first outer layers, to embed said at least one busbar between the corresponding one of the at least two different printed circuit first outer layers and the at least one printed circuit second outer layer;
   bending said at least one busbar in each inter-circuit space.

14. The method according to claim 13, wherein the bending comprises:
   bending said at least one busbar in each inter-circuit space with a bending tool; and
   depositing an electrical insulator on said at least one busbar bended in each inter-circuit space.

* * * * *